(12) United States Patent
Hiyama et al.

(10) Patent No.: US 10,009,561 B2
(45) Date of Patent: Jun. 26, 2018

(54) DRIVING METHOD OF IMAGING APPARATUS, IMAGING APPARATUS, AND IMAGING SYSTEM

(71) Applicant: CANON KABUSHIKI KAISHA, Tokyo (JP)

(72) Inventors: Hiroki Hiyama, Sagamihara (JP); Hiroaki Kameyama, Kawasaki (JP); Yasuji Ikeda, Kawasaki (JP); Kazuhiro Sonoda, Kawasaki (JP); Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/357,656

(22) Filed: Nov. 21, 2016

(65) Prior Publication Data

US 2017/0150075 A1   May 25, 2017

(30) Foreign Application Priority Data

Nov. 24, 2015   (JP) .................................. 2015-229177

(51) Int. Cl.
| | |
|---|---|
| H04N 5/369 | (2011.01) |
| H04N 5/378 | (2011.01) |
| H04N 5/374 | (2011.01) |
| H01L 27/146 | (2006.01) |
| H04N 5/359 | (2011.01) |

(52) U.S. Cl.
CPC ..... *H04N 5/3594* (2013.01); *H01L 27/14612* (2013.01); *H01L 27/14643* (2013.01); *H04N 5/374* (2013.01); *H04N 5/378* (2013.01)

(58) Field of Classification Search
CPC ...... H04N 5/3594; H04N 5/378; H04N 5/374; H01L 27/14612; H01L 27/14643
See application file for complete search history.

(56) References Cited

U.S. PATENT DOCUMENTS

| | | | | |
|---|---|---|---|---|
| 2008/0291310 | A1* | 11/2008 | Ladd et al. ............ | H04N 5/374 348/308 |
| 2012/0312964 | A1* | 12/2012 | Yamashita et al. .... | H04N 5/347 250/208.1 |
| 2012/0327280 | A1* | 12/2012 | Ishii ...................... | H04N 5/374 348/301 |
| 2014/0022427 | A1* | 1/2014 | Goto et al. ........... | H04N 5/2355 348/296 |
| 2015/0229859 | A1* | 8/2015 | Guidash et al. ....... | H04N 5/374 348/308 |

FOREIGN PATENT DOCUMENTS

| | | |
|---|---|---|
| JP | 2006073732 A | 3/2006 |
| JP | 2008177357 A | 7/2008 |
| JP | 2012175259 A | 9/2012 |
| JP | 2013128130 A | 6/2013 |
| JP | 2014209696 A | 11/2014 |

\* cited by examiner

*Primary Examiner* — Shahbaz Nazrul
(74) *Attorney, Agent, or Firm* — Canon U.S.A., Inc. IP Division (57) ABSTRACT

In a period in which a pixel signal of another pixel is read out from the pixel, a transistor connected to a floating diffusion region of a pixel not performing reading out of a pixel signal from the pixel is turned off.

16 Claims, 9 Drawing Sheets

DRIVING METHOD OF IMAGING APPARATUS, IMAGING APPARATUS, AND IMAGING SYSTEM

BACKGROUND OF THE INVENTION

Field of the Invention

One disclosed aspect of the embodiments relates to a driving method of an imaging apparatus, an imaging apparatus, and an imaging system.

Description of the Related Art

There has been known an imaging apparatus in which a plurality of pixels is disposed over a plurality of rows and a plurality of columns. Each of the plurality of pixels includes a photoelectric conversion unit that generates an electric charge that is based on light, through photoelectric conversion, and a floating diffusion region to which electric charges accumulated by the photoelectric conversion unit are transferred. Furthermore, each of the plurality of pixels includes a pixel output unit that outputs an optical signal, which is a signal that is based on an electric potential of the floating diffusion region (signal that is based on the electric charges accumulated by the photoelectric conversion unit), to the outside of the pixel, and a reset transistor that resets the electric potential of the floating diffusion region. One node of the reset transistor is connected to the floating diffusion region. As an example of this imaging apparatus, Japanese Patent Laid-Open No. 2006-73732 describes an operation in which the reset transistor performs the reset of the electric potential of the floating diffusion region in a period until a corresponding pixel is selected as a pixel that outputs an optical signal.

In addition, Japanese Patent Laid-Open No. 2013-128130 describes an imaging apparatus including a pixel in which a capacitive element is configured to be connectable to a floating diffusion region via a connection transistor.

SUMMARY OF THE INVENTION

One aspect of the embodiments has been devised in view of the above-described issue, and an aspect of the embodiments is a driving method of an imaging apparatus including a plurality of pixels and an output line, the plurality of pixels each including a photoelectric conversion unit configured to accumulate electric charges, a floating diffusion region, a transfer transistor configured to transfer the electric charges of the photoelectric conversion unit to the floating diffusion region, an amplification transistor configured to output a signal that is based on an electric potential of the floating diffusion region, to the output line, and a transistor connected to the floating diffusion region, and the driving method includes reading out a signal from a second pixel of the plurality of pixels to the output line, after reading out a signal from a first pixel of the plurality of pixels to the output line, turning the transistor of the second pixel to an on state in a period in which a signal is read out from the first pixel to the output line, turning the transistor of the second pixel to an off state precedential to a period in which a signal is read out from the second pixel to the output line, and turning the transistor of the second pixel to the on state again in the period in which a signal is read out from the second pixel to the output line.

Further features of the disclosure will become apparent from the following description of exemplary embodiments (with reference to the attached drawings).

DESCRIPTION OF THE EMBODIMENTS

In some cases, a transistor connected to a floating diffusion region is turned on precedential to electric charges accumulated by a photoelectric conversion unit being transferred to the floating diffusion region. While this transistor is in the on state, the electric charges in the floating diffusion region are trapped in the transistor. Then, after the transistor is turned off, there occurs a phenomenon in which the electric charges trapped in the transistor are discharged to the floating diffusion region over a predetermined period. The discharge of the electric charges trapped in the transistor to the floating diffusion region has increased noise components in a signal output by a pixel.

In the following exemplary embodiments, the description will be given of a technique of reducing noise components in a signal output by a pixel.

Exemplary embodiments will be described below with reference to the drawings.

First Exemplary Embodiment

A configuration of an imaging apparatus 100 according to a first exemplary embodiment will be described using FIG. 1.

Typically, the imaging apparatus 100 is a complementary metal-oxide semiconductor (CMOS) image sensor. The imaging apparatus 100 photoelectrically-converts incident light indicating a subject image, and outputs an electric signal obtained by the photoelectric conversion, to the outside as digital data. The imaging apparatus 100 includes a pixel array 110 in which a plurality of pixels 111 is disposed over a plurality of rows and a plurality of columns. Hereinafter, columns in which the pixels 111 are disposed will be described as pixel columns, and rows in which the pixels 111 are disposed will be described as pixel row. Each of the plurality of pixels 111 generates electric charges by photoelectrically-converting incident light. In the present exemplary embodiment, pixels are represented in a simplified manner as being disposed in 4 rows and 4 columns, for the sake of simplicity. Nevertheless, pixels may be constituted by further larger numbers of rows and columns. Typically, the pixel array 110 includes several tens of millions of the pixels 111.

The imaging apparatus 100 further includes a vertical scanning circuit 140. The vertical scanning circuit 140 sequentially supplies driving pulse signals to pixel control lines 112 disposed for the respective pixel rows, on a pixel-row basis. If the driving pulse signal is supplied to the pixel control line 112, each of the pixels 111 included in a corresponding pixel row outputs a signal corresponding to the photoelectrically-converted electric charge, to a vertical output line 113 as a voltage signal. In the present exemplary embodiment, each of the pixels 111 outputs, to the vertical output line 113, a noise signal, which is a reset level signal of the pixel 111, and an optical signal obtained by superimposing the noise signal on the signal corresponding to the electric charges generated by the photoelectric conversion. In addition, in the following description, noise signals and optical signals that are output by the pixels 111 will be collectively referred to as pixel signals in some cases.

A current source 125 is connected to the vertical output lines 113.

The imaging apparatus 100 further includes amplification circuits 120, and amplifies optical signals input from the pixels 111 via the vertical output lines 113, to supply the amplified optical signals to analog-to-digital (A/D) converters 130.

The imaging apparatus 100 further includes a ramp signal supplying unit 170 and a counter 180. The ramp signal supplying unit 170 supplies a ramp signal Vramp to each of the A/D converters 130 via a ramp signal line 171. The ramp signal Vramp is a signal of which an electric potential monotonically varies as time advances. The counter 180 supplies a count value Cnt to each of the A/D converters 130 via a count data line 181.

The imaging apparatus 100 further includes a horizontal scanning circuit 150 and a signal processing unit 190. The horizontal scanning circuit 150 transfers digital data output by the A/D converter 130, to digital signal lines 191 and 192, for each column. The digital data transferred to the digital signal lines 191 and 192 are supplied to the signal processing unit 190. In the present exemplary embodiment, digital data corresponding to noise signals are sequentially output to the digital signal line 191, and digital data corresponding to optical signals are sequentially output to the digital signal line 192. The signal processing unit 190 performs CDS processing of subtracting digital data corresponding to noise signals, from digital data corresponding to optical signals. The signal processing unit 190 thereby obtains digital data in which noise components are reduced from the digital data corresponding to optical signals. The signal processing unit 190 outputs the digital data with reduced noise components to the outside of the imaging apparatus 100.

The imaging apparatus 100 further includes a timing control unit 195 that controls an operation of the imaging apparatus 100 by supplying a pulse signal to each of the above-described constituent elements.

Figure 2:
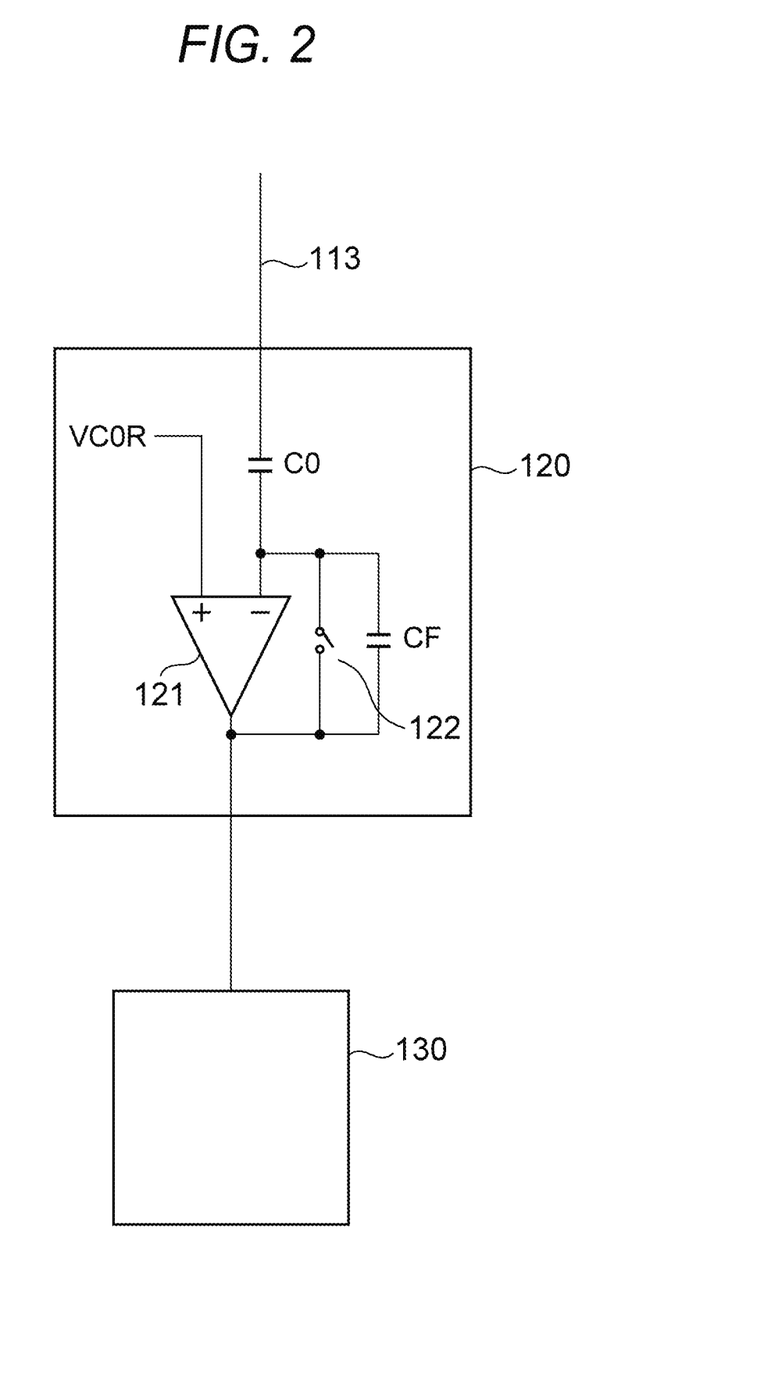
FIG. 2 is a diagram illustrating a configuration of an amplification circuit.

FIG. 2 is a diagram illustrating the details of a configuration of the amplification circuit 120. The amplification circuit 120 includes an operational amplifier 121, a capacitive element C0, a capacitive element CF, and a switch 122. The vertical output line 113 is connected to an inverting input node of the operational amplifier 121 via the capacitive element C0. The inverting input node of the operational amplifier 121 is further connected to one node of the capacitive element CF and one node of the switch 122. The other node of the capacitive element CF and the other node of the switch 122 are connected to an output node of the operational amplifier 121. A voltage VC0R is input to a non-inverting input node of the operational amplifier 121. The amplification circuit 120 outputs a signal obtained by amplifying a signal input from the vertical output line 113 to the inverting input node via the capacitive element C0, at a ratio C0/CF.

Figure 3:
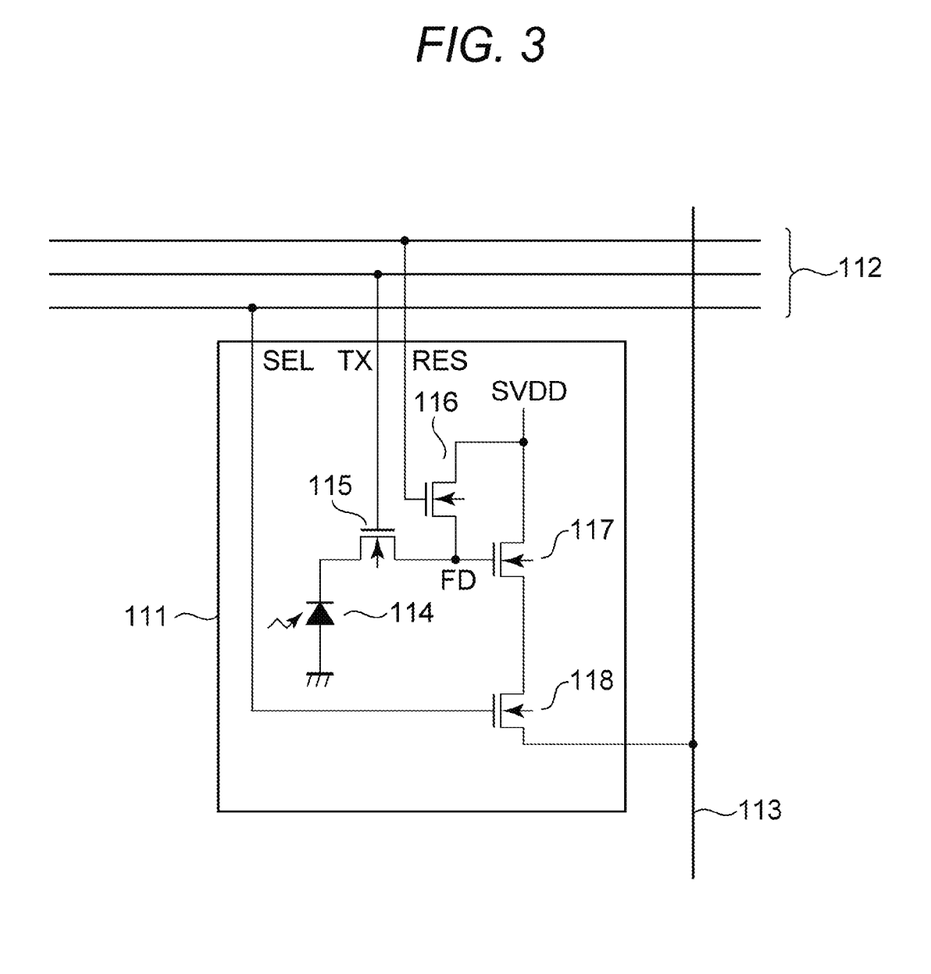
FIG. 3 is a diagram illustrating a configuration of a pixel.

FIG. 3 is a diagram illustrating a configuration of the pixel 111. The pixel 111 illustrated in FIG. 3 indicates one pixel 111 of the pixels 111 disposed in 4 rows and 4 columns that are included in the pixel array 110 illustrated in FIG. 1.

The pixel 111 includes a photodiode 114 that performs photoelectric conversion, and a plurality of transistors. The photodiode 114 serves as a photoelectric conversion unit that generates an electric charge upon receiving incident light. The photodiode 114 is connected to a floating diffusion region FD via a transfer transistor 115. In addition, the floating diffusion region FD is connected to a power source SVDD via a reset transistor 116, and is also connected to a gate electrode of an amplification transistor 117. A first main electrode of the amplification transistor 117 is connected to the power source SVDD, and a second main electrode of the amplification transistor 117 is connected to the vertical output line 113 via a selection transistor 118. A gate electrode of the selection transistor 118 is connected to a row selection line, which is one of the pixel control lines 112. The row selection line transmits a signal SEL. A gate electrode of the reset transistor 116 is connected to a reset line, which is one of the pixel control lines 112. The reset line transmits a signal RES. In addition, a gate electrode of the transfer transistor 115 is connected to a transfer signal line, which is one of row control lines. The transfer signal line transmits a signal TX. The vertical scanning circuit 140 serves as a control unit that controls an operation of the pixels ill.

If the signal SEL becomes a high level, the current source 125 flows current in the amplification transistor 117 via the vertical output line 113 and the selection transistor 118. A period in which current flows in the amplification transistor 117 corresponds to a period in which a signal is read out from the pixel 111 to the vertical output line 113.

Figure 4:
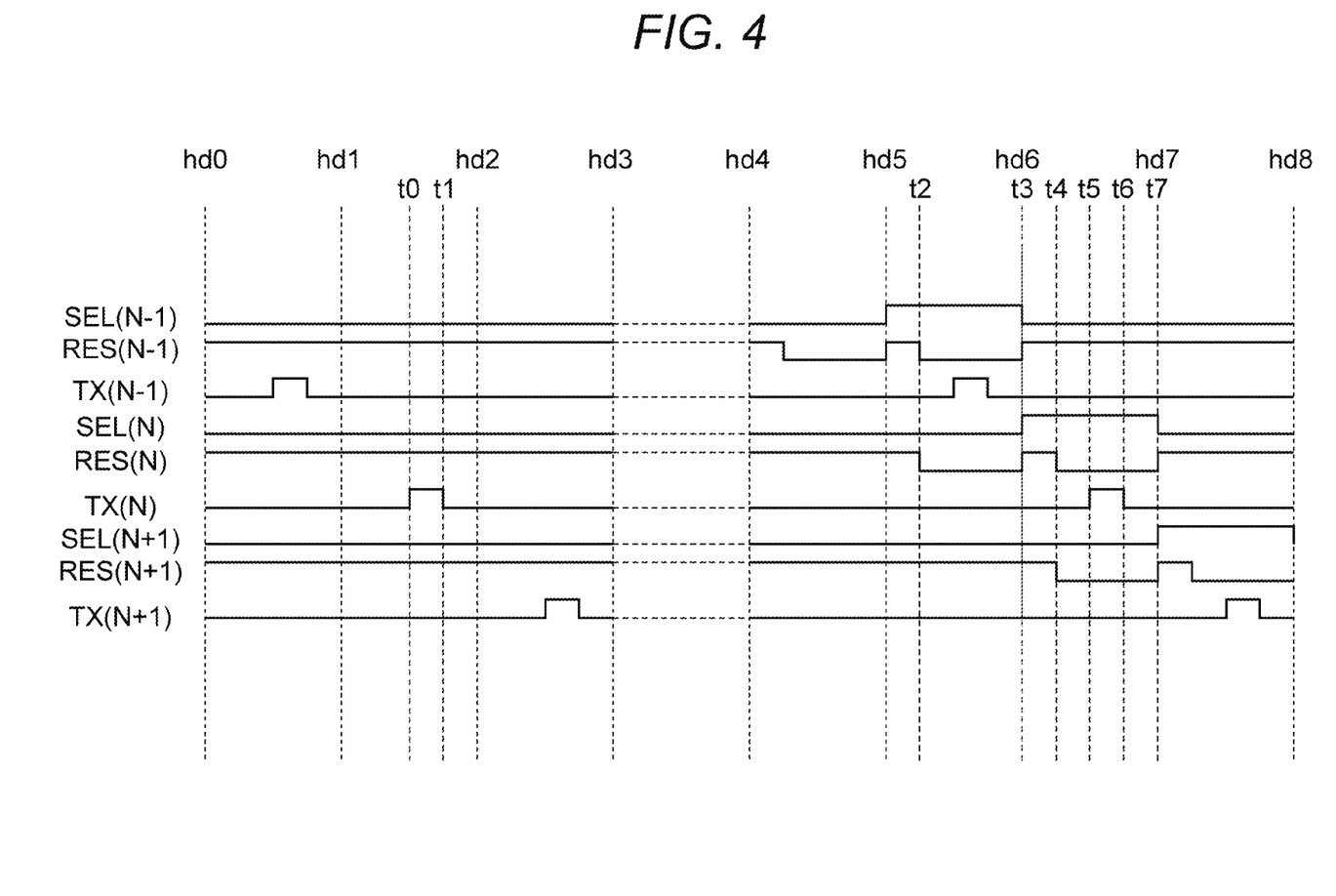
FIG. 4 is a diagram illustrating operations of the imaging apparatus.

Next, operations of the imaging apparatus 100 will be described using FIG. 4. FIG. 4 illustrates operations of the imaging apparatus 100 that are related to the pixels 111 on 3 rows, i.e., an (N−1)th row, an Nth row, and an (N+1)th row. Specifically, FIG. 4 illustrates operations of exposure start, accumulation, and pixel signal reading out of the pixels 111 on the 3 rows. Each of times hd0 to hd8 illustrated in FIG. 4 indicates a start time of a horizontal scanning period. In addition, each of the times hd0 to hd8 also indicates a start time of vertical scanning performed by the vertical scanning circuit 140.

In a period from a time t0 to a time t1, the signal RES (N) is set at the high level, and the signal TX (N) is set at the high level. The electric charges in the photodiode 114 are thereby reset. If the signal TX1 becomes a low level at the time t1, the photodiode 114 starts the accumulation of electric charges that is based on light (exposure start).

In a period from when the signal TX (N) becomes the low level at the time t1 to when the signal TX (N) becomes the high level next at a time t5, a state in which electric charges are accumulated in the photodiodes 114 of the pixels 111 on the Nth row is caused. This period from the time t1 to the time t5 corresponds to a signal accumulation period of the pixels 111 on the Nth row. In the period, the signal RES (N) is maintained at the high level. As a result, electric charges overflowing from the photodiodes 114 of the pixels 111 on the Nth row are discharged to the power sources SVDD via the floating diffusion regions FD and the reset transistors 116. This reduces electric charges leaking from the pixels 111 of which the photodiodes 114 have overflown, to neighboring pixels 111 (blooming). On the other hand, because the reset transistor 116 continues to be in the on state over the signal accumulation period, electric charges are trapped in the reset transistor 116. Typically, the electric charges are trapped in a gate insulating film of the reset transistor 116.

At a time t2, the signal RES (N) shifts from the high level to the low level. This operation is performed in a period in which optical signals are read out from the pixels 111 on the (N−1)th row that are scanned prior to the pixels 111 on the Nth row. A period from the time t2 to a time t3, in which this operation is performed, corresponds to a preliminary selection period of the pixels 111 on the Nth row. In other words, in a period in which the current source 125 flows current in the amplification transistors 117 of the pixels 111 on the (N−1)th row, which are first pixels, the reset of electric potentials of the floating diffusion regions FD of the pixels 111 on the Nth row, which are second pixels, is canceled.

By the signal RES (N) shifting from the high level to the low level at the time t2, the reset transistor 116 is turned off. As a result, electric charges trapped in the reset transistor 116 are discharged to the floating diffusion region FD.

At the time t3, the signal SEL (N) on the Nth row becomes the high level, and the corresponding amplification transistor 117 is connected to the vertical output line 113. The current source 125 thereby flows current in the amplification transistor 117. The amplification transistor 117 constitutes a source follower circuit together with the current source 125 connected to the vertical output line 113. Similarly, at the time t3, the signal RES (N) becomes the high level, and the floating diffusion regions FD of the pixels 111 on the first row are reset by the power source SVDD via the reset transistor 116. As a result, in a period from the time t2 to the time t3, electric charges trapped in the reset transistor 116 and discharged from the reset transistor 116 to the floating diffusion region FD are reset. A period from the time t3 to a time t4, in which the reset transistor 116 is in the on state, is shorter than a period from a time equal to or earlier than the time hd0 to the time t2, in which the reset transistor 116 is in the on state in the signal accumulation period. Thus, the amount of electric charges trapped in the reset transistor 116 in the period from the time t3 to the time t4, in which the reset transistor 116 is in the on state, is smaller than the amount of electric charges trapped in the reset transistor 116 in the signal accumulation period. Accordingly, a variation in the electric potential of the floating diffusion region FD that is caused by the reset transistor 116 being turned off at the time t4 is smaller than a variation in the electric potential of the floating diffusion region FD that is caused by the reset transistor 116 being turned off at the time t2.

After the reset transistor 116 is turned off at the time t4, the amplification transistor 117 outputs a noise signal based on a voltage to which the floating diffusion region FD is reset. This signal is referred to as an N signal. The N signal is converted into a digital signal by the A/D converter 130 after being amplified by the amplification circuit 120.

The signal TX (N) is set at the high level over a period from the time t5 to a time t6. As a result, electric charges in the photodiodes 114 on the Nth row are transferred to the floating diffusion regions FD via the transfer transistors 115. The amplification transistor 117 outputs a signal that is based on the electric potential of the floating diffusion region FD to which electric charges in the photodiode 114 are transferred, to the vertical output line 113. This signal output by the amplification transistor 117 is an optical signal, which is a signal obtained by superimposing a signal corresponding to the electric charges accumulated by the photodiode 114, on the above-described N signal. This optical signal will be described as an N+S signal. Similarly to the N signal, the N+S signal is also converted into a digital signal by the A/D converter 130 after being amplified by the amplification circuit 120.

At a time t7, the signal SEL (N) becomes the low level, and a reading out operation of signals from the pixels 111 on the Nth row is ended. Subsequently, an operation similar to the signal reading out operation of the pixels 111 on the Nth row is repeated for the pixels 111 on the (N+1)th row.

As described above, by turning off the reset transistors 116 before the current sources 125 flowing current in the amplification transistors 117 of the pixels 111 on the Nth row, electric charges trapped in the gate insulating films of the reset transistors 116 are discharged. This can reduce the influence on the N signals and the N+S signals of the pixels 111 on the Nth row that is caused by electric charges trapped in the reset transistors 116.

In addition, various types of counters can be used as the counter 180. For example, the counter 180 may be a gray code counter or a binary counter.

In addition, in the present exemplary embodiment, a single counter 180 supplies a common count signal to a plurality of A/D converters 130. As another example, the plurality of A/D converters 130 may each include a counter. In this case, the counter 180 may be able to switch between counting up and counting down. The A/D conversion of the N signal is performed using one of the counting up and the counting down, and the A/D conversion of the N+S signal is performed using the other one of the counting up and the counting down. As a result, at the end of the A/D conversion of the N+S signal, a digital signal corresponding to a signal obtained by subtracting the N signal from the N+S signal can be obtained.

In addition, in the present exemplary embodiment, the reset of the floating diffusion regions FD of the pixels 111 on the Nth row is canceled in the period in which current flows in the amplification transistors 117 of the pixels 111 on the (N−1)th row. As another example, the reset of the floating diffusion regions FD of the pixels 111 on the Nth row may be canceled in a period in which current flows in the amplification transistors 117 of pixels 111 from which pixel signals are read out prior to the pixels 111 on the (N−1)th row. Which period the cancellation timing of the reset of the floating diffusion regions FD of the pixels 111 on the Nth row is to be provided in, i.e., the cancellation timing is to be provided in a period in which current flows in the amplification transistors 117 of the pixels 111 on which row, can be set according to a range in which blooming can be allowed.

Figure 8:
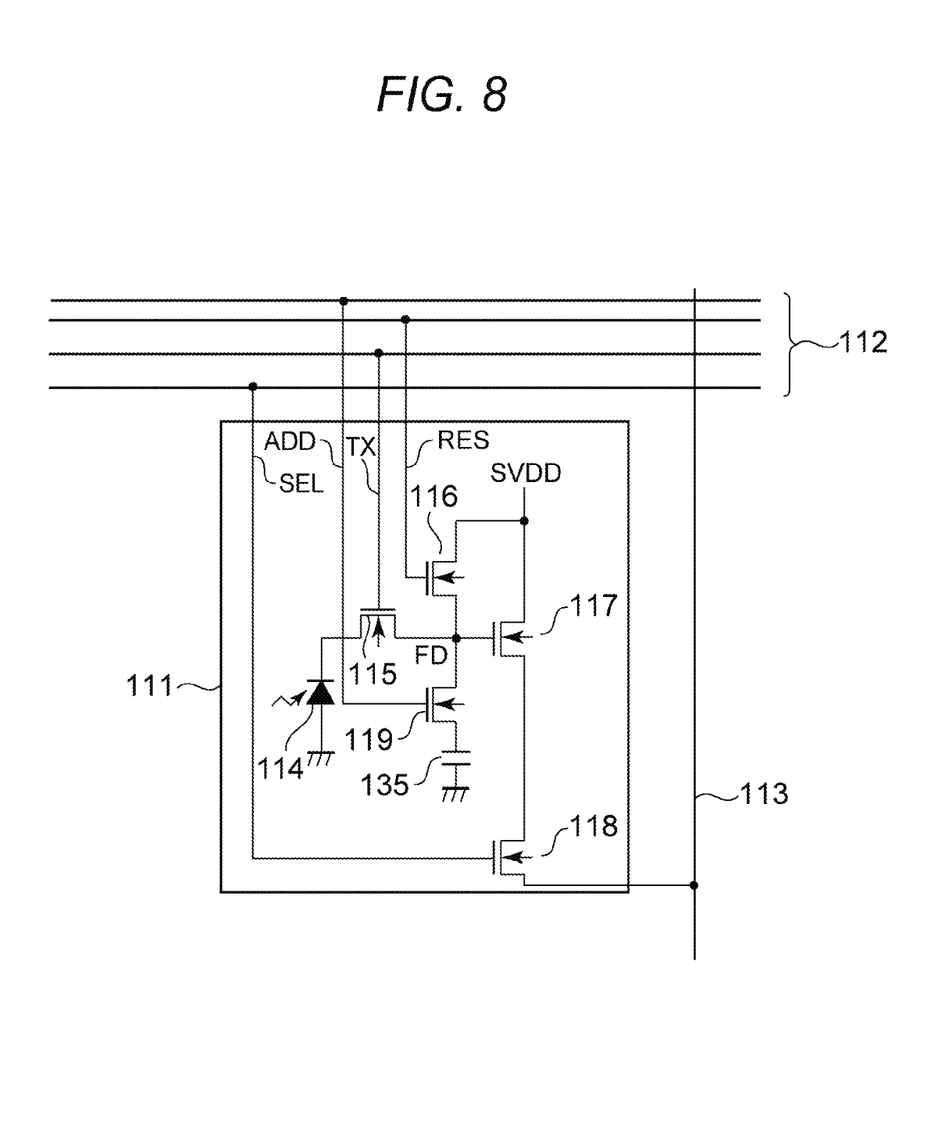
FIG. 8 is a diagram illustrating a configuration of a pixel.

In addition, as illustrated in FIG. 8, the pixel 111 may be configured to further include a connection transistor 119 and a capacitive element 135. The capacitive element 135 is connected to the floating diffusion region FD via the connection transistor 119. The connection transistor 119 is a transistor that switches connection and non-connection of the capacitive element 135 and the floating diffusion region FD. A signal ADD is input to a gate electrode of connection transistor 119 from one of the pixel control lines 112. If the signal ADD is set at the high level, the capacitive element 135 is connected to the floating diffusion region FD. As a result, an electric charge-voltage conversion coefficient for converting an electric charge of the photodiode 114 into a voltage becomes smaller. Thus, by switching the signal level of the signal ADD, the signal level of a signal corresponding to the electric charge of the photodiode 114 can be switched.

If the signal ADD (N) is set at the high level in the signal accumulation period, in the period from the time t2 to the time t3, in which the signal RES (N) is set at the low level, the signal ADD (N) is also set at the low level. If the signal ADD (N) is maintained at the high level, electric charges trapped in the reset transistor 116 are discharged to the connection transistor 119 and the capacitive element 135. Thus, even if the signal RES (N) is set at the high level in the period from the time t3 to the time t4, all the electric charges discharged to the connection transistor 119 and the capacitive element 135 may fail to be reset. Therefore, in the period from the time t2 to the time t3, in which the signal RES (N) is set at the low level, the signal ADD (N) is also set at the low level. The timing at which the signal ADD (N) is set at the low level is only required to be equal to or earlier than the timing at which the signal RES (N) is set at the low level. In other words, it is sufficient that the signal ADD (N) is at the low level in the period in which the signal RES (N) is at the low level. More specifically, it is sufficient that, precedential to the period in which current flows in the amplification transistors 117 of the pixels 111 on the Nth row, a transistor connected to the floating diffusion region FD is turned off from the on state, and is turned on again in the period in which current flows in the amplification transistors 117 of the pixels 111 on the Nth row. This transistor may be the reset transistor 116 described in the present exemplary embodiment, or may be the connection transistor 119. By the connection transistor 119 being in the on state in the signal accumulation period, electric charges of the photodiode 114 are trapped in the connection transistor 119 as well. The electric charges trapped in the connection transistor 119 are discharged to the floating diffusion region FD, similarly to the case of the reset transistor 116.

In addition, in the present exemplary embodiment, the description has been given of a configuration in which the pixel 111 includes the selection transistor 118. The present exemplary embodiment is not limited to this example. A configuration in which the pixel 111 does not include the selection transistor 118 can be employed. In this case, the selection of the pixel 111 that is caused to output a pixel signal to the vertical output line 113, from among the plurality of pixels 111, is controlled by the electric potential of the reset of the floating diffusion region FD. In other words, for pixels 111 that are not caused to output signals to the vertical output lines 113, among the plurality of pixels 111, the power source SVDD to be applied to the reset transistor 116 is set to a voltage at which the amplification transistor 117 enters the off state. Then, the vertical scanning circuit 140 sets the signal RES at the high level, to apply the voltage at which the amplification transistor 117 enters the off state, to the floating diffusion region FD. As a result, the amplification transistors 117 of the pixels 111 that are not caused to output signals to the vertical output lines 113, among the plurality of pixels 111, enter the off state. In other words, the current source 125 does not flow current in the amplification transistor 117 in the off state.

On the other hand, for pixels 111 that are caused to output signals to the vertical output lines 113, the power source SVDD to be applied to the reset transistor 116 is set to a voltage at which the amplification transistor 117 enters the on state. Then, the vertical scanning circuit 140 sets the signal RES at the high level, to apply the voltage at which the amplification transistor 117 enters the on state, to the floating diffusion region FD. As a result, the amplification transistors 117 of the pixels 111 that are caused to output signals to the vertical output lines 113, among the plurality of pixels 111, enter the on state. In other words, the current source 125 flows current in the amplification transistor 117 in the on state. In this manner, even in the case in which the pixels 111 do not include the selection transistor 118, pixels 111 that are caused to output signals to the vertical output lines 113 can be selected from among the plurality of pixels 111.

Second Exemplary Embodiment

An imaging apparatus according to the present exemplary embodiment will be described below with reference to the drawings.

Because the configuration of the pixels 111 and a driving timing of the imaging apparatus differ from those in the first exemplary embodiment, these points will be mainly described.

Figure 1:
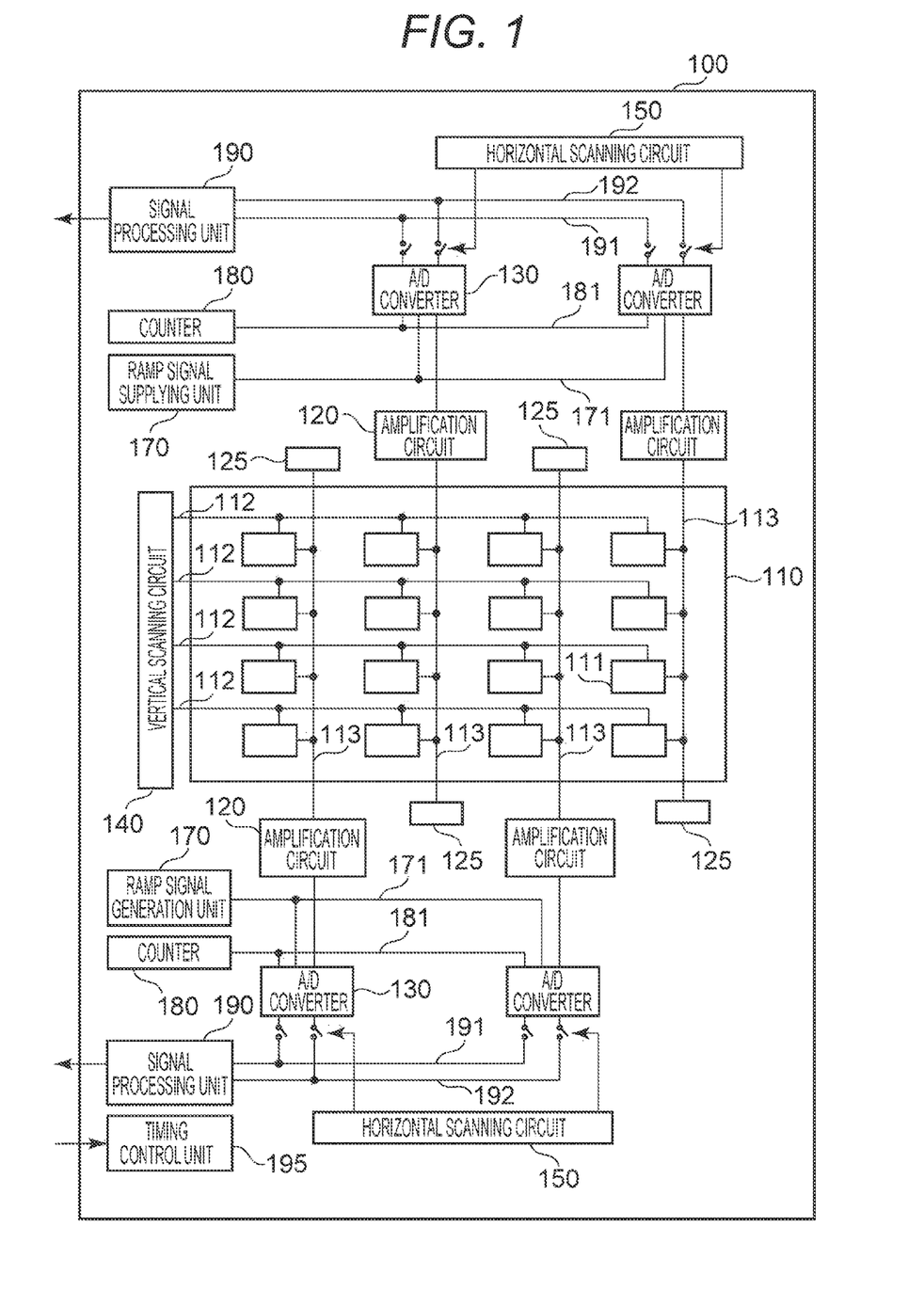
FIG. 1 is a diagram illustrating a configuration of an imaging apparatus.
Figure 5:
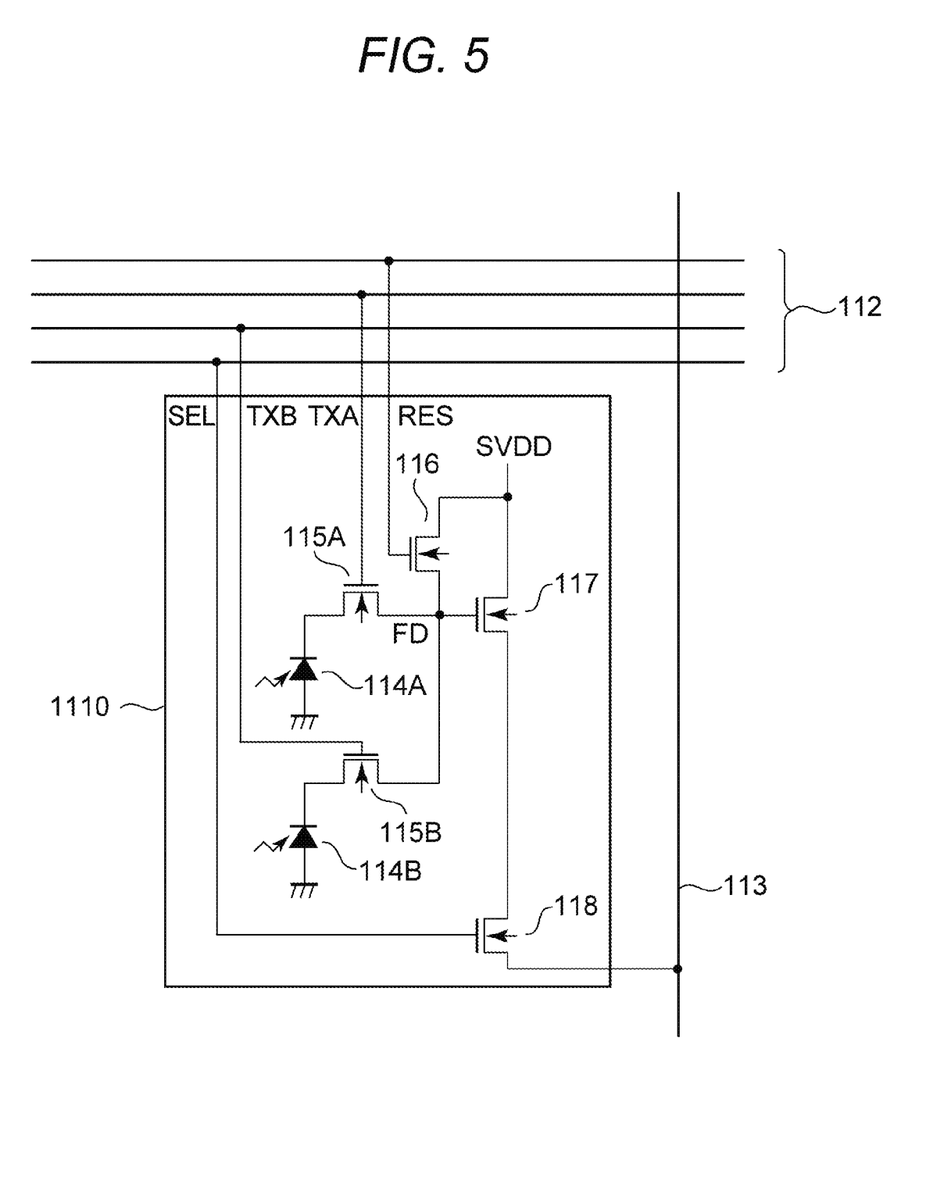
FIG. 5 is a diagram illustrating a configuration of a pixel.

The imaging apparatus according to the present exemplary embodiment includes a pixel 1110 illustrated in FIG. 5, in place of the pixel 111 illustrated in FIG. 1.

The pixel 1110 illustrated in FIG. 5 includes 2 photodiodes 114A and 114B each performing photoelectric conversion. In addition, the pixel 1110 includes transfer transistors 115A and 115B. The floating diffusion region FD is connected to the photodiode 114A via the transfer transistor 115A. In addition, the floating diffusion region FD is connected to the photodiode 114B via the transfer transistor 115B.

A gate electrode of the transfer transistor 115A is connected to a pixel control line which transmits the signal TXA, among the pixel control lines 112. In addition, a gate electrode of the transfer transistor 115B is connected to a pixel control line which transmits the signal TXB, among the pixel control lines 112.

In the pixel 1110 illustrated in FIG. 5, the 2 photodiodes 114A and 114B share the single amplification transistor 117, the single reset transistor 116, and the single selection transistor 118. With this configuration, the number of transistors for a single photodiode can be made smaller.

Figure 6:
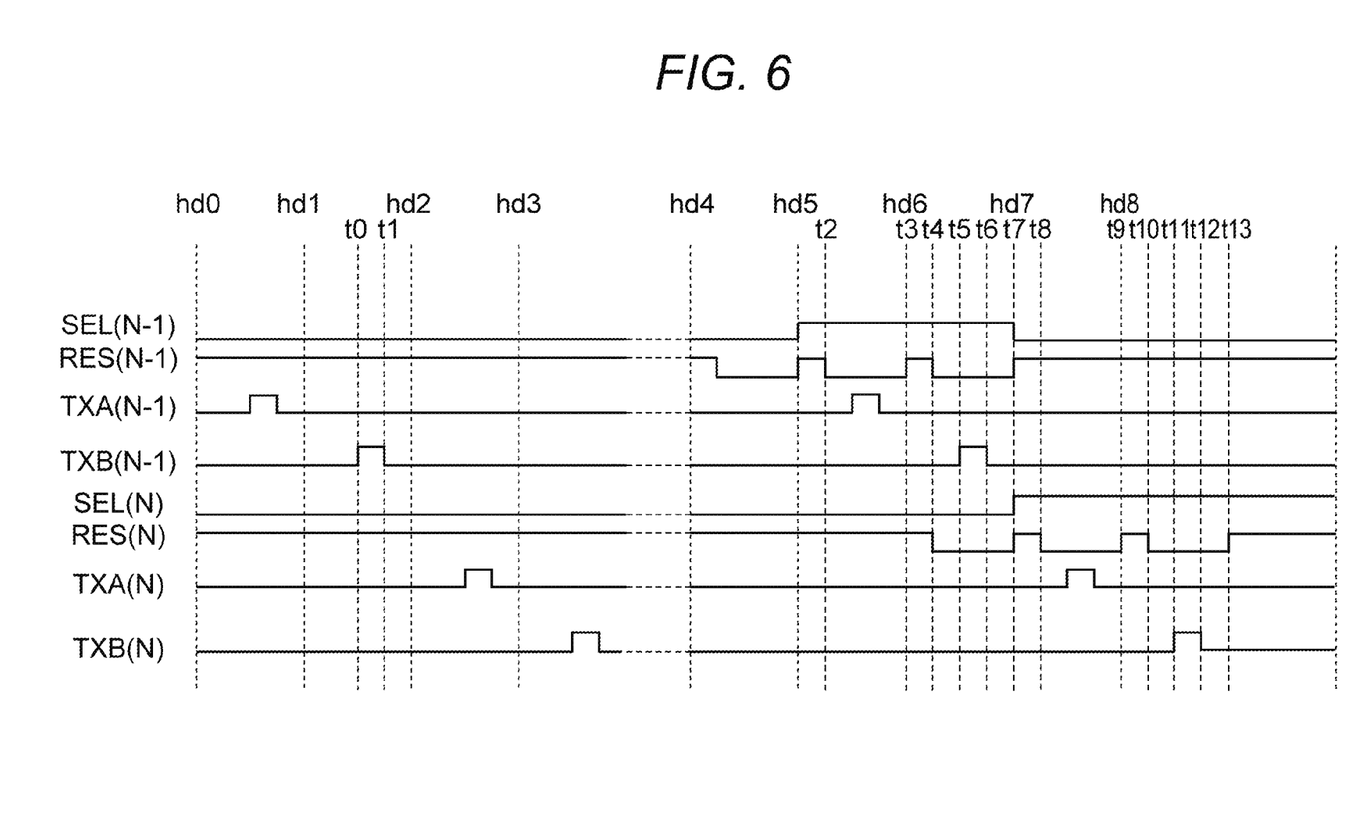
FIG. 6 is a diagram illustrating operations of an imaging apparatus.

FIG. 6 is a diagram illustrating operations of the imaging apparatus according to the present exemplary embodiment. FIG. 6 illustrates operations related to pixels 1110 on an (N−1)th row and pixels 1110 on an Nth row.

As in the operation illustrated in FIG. 6, at a time t7, the signal SEL (N) becomes the high level. Precedential to this, at a time t4, by the signal RES (N) shifting from the high level to the low level, the reset transistor 116 is turned off. The time t4 is in a period in which the current source 125 flows current in the amplification transistors 117 of the pixels 1110 on the (N−1)th row. In the period in which current flows in the amplification transistors 117 of the pixels 1110 on the (N−1)th row, the reset of the floating diffusion regions FD of the pixels 1110 on the Nth row is canceled. With this configuration, the imaging apparatus according to the present exemplary embodiment can obtain the same effect as the effect described in the first exemplary embodiment.

Furthermore, the effect obtained by the imaging apparatus according to the present exemplary embodiment will be described. In a case in which a preliminary selection period is not provided, the signal RES (N) remains at the high level even in the period from the time t4 to the time t7. At a time t8, the signal RES (N) becomes the low level, so that the reset transistor 116 is turned off. As a result, electric charges trapped in the reset transistor 116 are discharged to the floating diffusion region FD. Accordingly, electric charges in the photodiode 114A are transferred to the floating diffusion region FD being in a state in which the electric charges trapped in the reset transistor 116 are discharged. Thus, an N+S signal that is based on the electric charges in the photodiode 114A is a signal including a signal that is based on electric charges trapped in the reset transistor 116.

The signal RES (N) is set at the high level in a period from a time t9 to a time t10. As a result, the electric potential of the floating diffusion region FD is reset. Through the reset, the electric charges discharged to the floating diffusion region FD after being trapped in the reset transistor 116 are discharged to the power source SVDD. Accordingly, electric charges in the photodiode 114B are transferred to the floating diffusion region FD being in a state in which the electric charges in the reset transistor 116 that have been discharged to the floating diffusion region FD are reset. Thus, the amount of components of the signal that is based on electric charges trapped in the reset transistor 116 that are included in the N+S signal is smaller in the N+S signal that is based on the electric charges in the photodiode 114B, than that in the N+S signal that is based on the electric charges in the photodiode 114A. As a result, even if light rays of the same light amount enter the photodiodes 114A and 114B, in an image generated using signals output by the imaging apparatus, a luminance difference is generated between a location corresponding to the photodiode 114A, and a location corresponding to the photodiode 114B.

On the other hand, in the imaging apparatus according to the present exemplary embodiment, the signal RES (N) is set at the low level in a period from the time t4 to the time t6. Then, the signal RES (N) is set at the high level in a period from the time t7 to the time t8. As a result, electric charges in the photodiode 114A are transferred to the floating diffusion region FD being in a state in which the electric charges in the reset transistor 116 that have been discharged to the floating diffusion region FD are reset. Thus, the amount of components of the signal that is based on electric charges trapped in the reset transistor 116 that are included in the N+S signal is substantially equal between the N+S signal that is based on the electric charges in the photodiode 114B, and the N+S signal that is based on the electric charges in the photodiode 114A. Accordingly, if light rays of the same light amount enter the photodiodes 114A and 114B, in an image generated using signals output by the imaging apparatus, a luminance difference is difficult to be generated between a location corresponding to the photodiode 114A, and a location corresponding to the photodiode 114B. For preferably obtaining this effect, it is desirable to set a timing at which the signal RES (N) is set at the low level at the time t4, in such a manner that the length of the period from the time t4 to the time t7 becomes the same as that of the period from the time t8 to the time t9. In addition, for obtaining this effect further preferably, it is desirable to set the length of the period from the time t7 to the time t8, which is a period in which the signal RES (N) is at the high level, and the length of the period from the time t9 to the time t10, so as to be the same length. As a result, the state of the floating diffusion region FD in which electric charges in the photodiode 114A are transferred, and the state thereof in which electric charges in the photodiode 114B are transferred can be easily matched.

Third Exemplary Embodiment

An imaging apparatus according to the present exemplary embodiment will be described mainly based on points different from the second exemplary embodiment.

The configuration of the imaging apparatus according to the present exemplary embodiment is the same as the configuration described in the second exemplary embodiment.

Operations of the imaging apparatus according to the present exemplary embodiment will be described with reference to FIG. 7.

Figure 7:
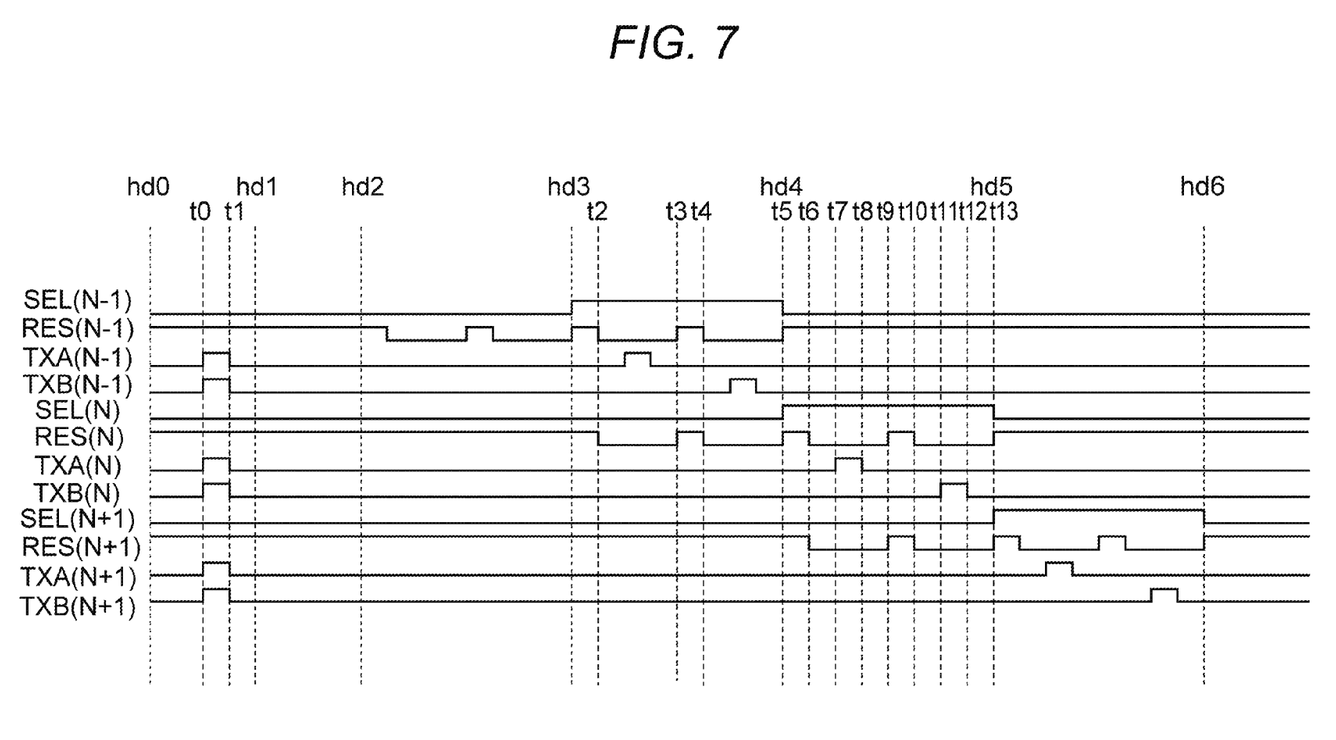
FIG. 7 is a diagram illustrating operations of an imaging apparatus.

FIG. 7 illustrates operations of the imaging apparatus 100 that are related to the pixels 1110 on 3 rows, i.e., an (N−1)th row, an Nth row, and an (N+1)th row. Specifically, FIG. 7 illustrates operations of exposure start, accumulation, and pixel signal reading out of the pixels 1110 on the 3 rows.

The signal RES, the signal TXA, and the signal TXB that are to be supplied to all the pixel rows are set at the high level in a period from the time t0 to the time t1. As a result, electric charges in the photodiodes 114A and 114B of all the pixels 1110 are reset. In addition, from the time t1 at which the signal TXA and the signal TXB that are to be supplied to all the pixel rows become the low level, the accumulation of electric charges in the photodiodes 114A and 114B of all the pixels 1110 is started. In this manner, if the exposure start timings are synchronized among all the pixels 1110, it is preferable to end exposure in all the pixels 1110 using a mechanical shutter (not illustrated), in a period from a time hd1 to a time hd2. As a result, the exposure start timings and the exposure end timings can be synchronized among all the pixels 1110.

In the imaging apparatus according to the present exemplary embodiment, the signal RES (N) is set at the low level at the time t2, and set at the high level in the period from the time t3 to the time t4. In addition, the signal RES (N) is set at the high level in the period from the time t5 to the time t6, and in the period from the time t9 to the time t10.

Also in the imaging apparatus according to the present exemplary embodiment, in the period in which current flows in the amplification transistors 117 of the pixels 1110 on the (N−1)th row, the signal RES (N) is set at the low level, and the reset of electric potentials of the floating diffusion regions FD of the pixels 1110 on the Nth row is canceled. As a result, the effect described in the second exemplary embodiment can be obtained.

In addition, the timing of the time t4 is set in such a manner that the period in which the signal RES (N) is set at the low level becomes equal to the period from the time t4 to the time t5, and the period from the time t6 to the time t9. As a result, the amount of components of the signal that is based on electric charges trapped in the reset transistor 116 that are included in the N+S signal becomes substantially equal between the N+S signal that is based on the electric charges in the photodiode 114B, and the N+S signal that is based on the electric charges in the photodiode 114A. Accordingly, if light rays of the same light amount enter the photodiodes 114A and 114B, in an image generated using signals output by the imaging apparatus, a luminance difference is difficult to be generated between a location corresponding to the photodiode 114A, and a location corresponding to the photodiode 114B.

In addition, in the present exemplary embodiment, as compared with the operations in the second exemplary embodiment, the number of times the floating diffusion region FD is reset precedential to the period in which current flows in the amplification transistors 117 of the pixels 1110 on the Nth row is set to be large. With this configuration, by canceling the reset of the floating diffusion region FD at the time t2, the electric charges discharged from the reset transistor 116 to the floating diffusion region FD can be discharged from the floating diffusion region FD more preferably.

Fourth Exemplary Embodiment

The present exemplary embodiment relates to an imaging system including the imaging apparatus according to each of the above-described exemplary embodiments.

Figure 9:
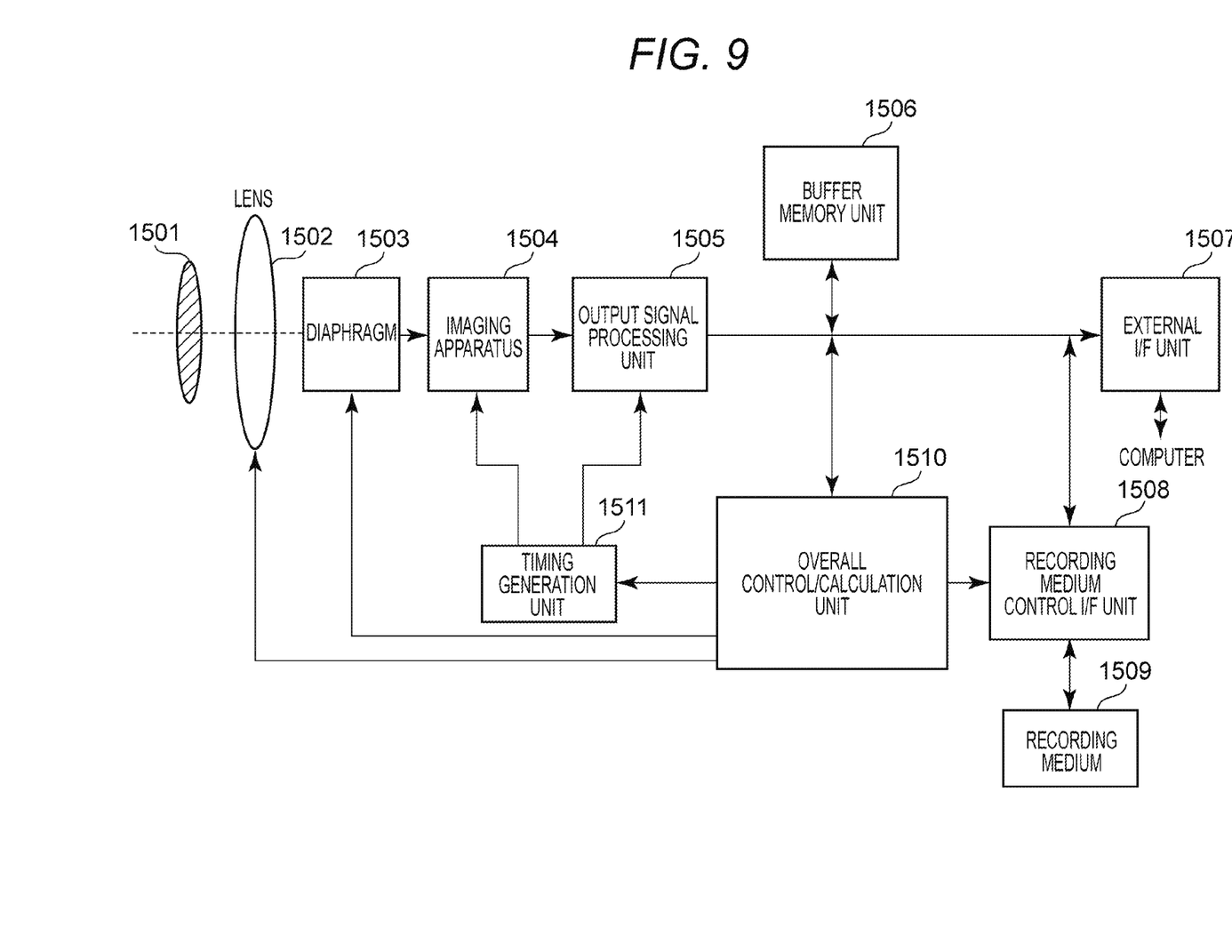
FIG. 9 is a diagram illustrating a configuration of an imaging system.

Examples of the imaging system include a digital still camera, a digital camcorder, a monitoring camera, and the like. FIG. 9 illustrates a schematic diagram of a case in which the imaging apparatus is applied to a digital still camera as an example of the imaging system.

The imaging system illustrated in FIG. 9 as an example includes a barrier 1501 for protecting a lens, a lens 1502 that forms an optical image of a subject on an imaging apparatus 1504, and a diaphragm 1503 for making the amount of light passing through the lens 1502, variable. The lens 1502 and the diaphragm 1503 constitute an optical system for focusing light on the imaging apparatus 1504. In addition, the imaging system illustrated in FIG. 9 as an example includes an output signal processing unit 1505 that processes an output signal output by the imaging apparatus 1504. The output signal processing unit 1505 performs an operation of outputting a signal after performing various types of correction and compression as necessary.

The imaging system illustrated in FIG. 9 as an example further includes a buffer memory unit 1506 for temporarily storing image data, and an external interface unit 1507 for communicating with an external computer and the like. The imaging system further includes a detachable recording medium 1509, such as a semiconductor memory, for recording or reading out imaging data, and a recording medium control interface unit 1508 for performing recording or reading out on the recording medium 1509. The imaging system further includes an overall control/calculation unit 1510 that controls various calculations and the entire digital still camera, and a timing generation unit 1511 that outputs various timing signals to the imaging apparatus 1504 and the output signal processing unit 1505. Here, the timing signals and the like may be input from the outside, and the imaging system is only required to include at least the imaging apparatus 1504 and the output signal processing unit 1505 that processes an output signal output from the imaging apparatus 1504.

As described above, the imaging system according to the present exemplary embodiment can perform an imaging operation by applying the imaging apparatus 1504.

In addition, all of the above-described exemplary embodiments merely indicate a specific example for embodying the disclosure, and are not to be construed as limiting the technical scope of the disclosure. In other words, the embodiments can be implemented in various forms without departing from the technical idea thereof or the main features thereof. In addition, the above-described exemplary embodiments can be implemented in combination with each other.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-229177, filed Nov. 24, 2015, which is hereby incorporated by reference herein in its entirety.

What is claimed is:

1. A driving method of an imaging apparatus including a plurality of pixels and an output line,
the plurality of pixels each including a photoelectric conversion unit configured to accumulate electric charges, a floating diffusion region, a transfer transistor configured to transfer the electric charges of the photoelectric conversion unit to the floating diffusion region, an amplification transistor configured to output a signal that is based on an electric potential of the floating diffusion region, to the output line, and a transistor connected to the floating diffusion region, the driving method comprising:

reading out a signal from a second pixel of the plurality of pixels to the output line, after reading out a signal from a first pixel of the plurality of pixels to the output line;
turning the transistor of the second pixel to an on state in a period in which a signal is read out from the first pixel to the output line;
turning the transistor of the second pixel to an off state precedential to a period in which a signal is read out from the second pixel to the output line; and
turning the transistor of the second pixel to the on state again in the period in which a signal is read out from the second pixel to the output line.

2. The driving method of the imaging apparatus according to claim 1,
wherein each of the plurality of pixels includes a capacitive element, and
wherein the transistor is a connection transistor configured to switch connection and non-connection of the capacitive element and the floating diffusion region.

3. The driving method of the imaging apparatus according to claim 1, wherein the transistor is a reset transistor configured to reset an electric potential of the floating diffusion region.

4. The driving method of the imaging apparatus according to claim 3,
wherein, in the second pixel, in a period in which an electric potential of the floating diffusion region is reset by the transistor being turned on, the photoelectric conversion unit is reset by the transfer transistor being turned on, and accumulation of the electric charges of the photoelectric conversion unit is performed by the transfer transistor being turned off, and
wherein, by the transistor continuing to be in the on state from a timing at which the transfer transistor is turned off, to a timing at which reset of the electric potential of the floating diffusion region of the second pixel is canceled by the transistor being turned off, precedential to the period in which a signal is read out from the second pixel to the output line, the floating diffusion region of the second pixel continues to be reset.

5. The driving method of the imaging apparatus according to claim 1,
wherein a length of a period in which the transistor of the second pixel is in the on state in the period in which a signal is read out from the first pixel to the output line, and a length of a period in which the transistor of the second pixel is in the on state again in the period in which a signal is read out from the second pixel to the output line are shorter than a length of a period in which the transistor of the second pixel is in the on state in the period in which a signal is read out from the first pixel to the output line.

6. The driving method of the imaging apparatus according to claim 4,
wherein a length of a period in which the transistor of the second pixel is in the on state in the period in which a signal is read out from the first pixel to the output line, and a length of a period in which the transistor of the second pixel is in the on state again in the period in which a signal is read out from the second pixel to the output line are shorter than a length of a period in which the transistor of the second pixel is in the on state in the period in which a signal is read out from the first pixel to the output line.

7. The driving method of the imaging apparatus according to claim 1, wherein each of the plurality of pixels further includes a second photoelectric conversion unit configured to accumulate electric charges, and a second transfer transistor configured to transfer the electric charges of the second photoelectric conversion unit to the floating diffusion region, wherein, precedential to the period in which a signal is read out from the second pixel to the output line, after a first operation of turning off the transistor of the second pixel, in the second pixel, a second operation of turning on the transistor, and further turning off the transistor, a third operation of transferring, by the transfer transistor, the electric charges of the photoelectric conversion unit to the floating diffusion region, a fourth operation of turning on the transistor, and further turning off the transistor, and a fifth operation of transferring, by the second transfer transistor, the electric charges of the second photoelectric conversion unit to the floating diffusion region, are sequentially performed, and wherein a length of a period from an end of the second operation to a start of the third operation, and a length of a period from an end of the fourth operation to a start of the fifth operation are substantially equal.

8. The driving method of the imaging apparatus according to claim 5, wherein each of the plurality of pixels further includes a second photoelectric conversion unit configured to accumulate electric charges, and a second transfer transistor configured to transfer the electric charges of the second photoelectric conversion unit to the floating diffusion region, wherein, precedential to the period in which a signal is read out from the second pixel to the output line, after a first operation of turning off the transistor of the second pixel, in the second pixel, a second operation of turning on the transistor, and further turning off the transistor, a third operation of transferring, by the transfer transistor, the electric charges of the photoelectric conversion unit to the floating diffusion region, a fourth operation of turning on the transistor, and further turning off the transistor, and a fifth operation of transferring, by the second transfer transistor, the electric charges of the second photoelectric conversion unit to the floating diffusion region, are sequentially performed, and wherein a length of a period from an end of the second operation to a start of the third operation, and a length of a period from an end of the fourth operation to a start of the fifth operation are substantially equal.

9. The driving method of the imaging apparatus according to claim 6, wherein each of the plurality of pixels further includes a second photoelectric conversion unit configured to accumulate electric charges, and a second transfer transistor configured to transfer the electric charges of the second photoelectric conversion unit to the floating diffusion region, wherein, precedential to the period in which a signal is read out from the second pixel to the output line, after a first operation of turning off the transistor of the second pixel, in the second pixel, a second operation of turning on the transistor, and further turning off the transistor, a third operation of transferring, by the transfer transistor, the electric charges of the photoelectric conversion unit to the floating diffusion region, a fourth operation of turning on the transistor, and further turning off the transistor, and a fifth operation of transferring, by the second transfer transistor, the electric charges of the second photoelectric conversion unit to the floating diffusion region, are sequentially performed, and wherein a length of a period from an end of the second operation to a start of the third operation, and a length of a period from an end of the fourth operation to a start of the fifth operation are substantially equal.

10. The driving method of the imaging apparatus according to claim 1, wherein the imaging apparatus includes a current source configured to flow current in the amplification transistor via the output line, wherein the period in which a signal is read out from the first pixel to the output line is a first period in which an amount of current flowing from the current source to the amplification transistor of the first pixel is more than an amount of current flowing from the current source to the amplification transistor of the second pixel, and wherein the period in which a signal is read out from the second pixel to the output line is a second period in which an amount of current flowing from the current source to the amplification transistor of the second pixel is more than an amount of current flowing from the current source to the amplification transistor of the first pixel.

11. The driving method of the imaging apparatus according to claim 9, wherein the imaging apparatus includes a current source configured to flow current in the amplification transistor via the output line, wherein the period in which a signal is read out from the first pixel to the output line is a first period in which an amount of current flowing from the current source to the amplification transistor of the first pixel is more than an amount of current flowing from the current source to the amplification transistor of the second pixel, and wherein the period in which a signal is read out from the second pixel to the output line is a second period in which an amount of current flowing from the current source to the amplification transistor of the second pixel is more than an amount of current flowing from the current source to the amplification transistor of the first pixel.

12. The driving method of the imaging apparatus according to claim 10, wherein, in a period from starting of the first period to ending of the second period, an amount of current flowing from the current source to the amplification transistor of each of the other pixels included in the plurality of pixels is less than an amount of current flowing in the amplification transistor of the first pixel in the first period and an amount of current flowing in the amplification transistor of the second pixel in the second period.

13. The driving method of the imaging apparatus according to claim 11, wherein, in a period from when the current source flows current in the amplification transistor of the first pixel, to when the current source flows current in the amplification transistor of the second pixel, the current source does not flow current in the amplification transistors of other pixels.

14. A driving method of an imaging apparatus including a plurality of pixels and an output line, the plurality of pixels each including a photoelectric conversion unit configured to accumulate electric charges, a floating diffusion region, a transfer transistor configured to transfer the electric charges of the photoelectric conversion unit to the floating diffusion region, an amplification transistor configured to output a signal that is based on an electric potential of the floating diffusion region, to the output line, and a transistor connected to the floating diffusion region, and the imaging apparatus further including a current source configured to flow current in the amplification transistor via the output line, the driving method comprising:

causing, in a first period, an amount of current flowing from the current source to an amplification transistor of a first pixel of the plurality of pixels to be more than an amount of current flowing in an amplification transistor of a second pixel of the plurality of pixels, and causing, in a second period after the first period, an amount of current flowing from the current source to the amplification transistor of the second pixel to be more than an amount of current flowing in the amplification transistor of the first pixel;

turning the transistor of the second pixel to an on state in the first period;

turning the transistor of the second pixel to the off state precedential to the second period; and turning the transistor of the second pixel to the on state again in the second.

15. An imaging apparatus including a plurality of pixels and an output line, the plurality of pixels each including a photoelectric conversion unit configured to accumulate electric charges, a floating diffusion region, a transfer transistor configured to transfer the electric charges of the photoelectric conversion unit to the floating diffusion region, an amplification transistor configured to output a signal that is based on an electric potential of the floating diffusion region, to the output line, a transistor connected to the floating diffusion region, and a control unit, wherein a signal is read out from a second pixel of the plurality of pixels to the output line, after a signal is read out from a first pixel of the plurality of pixels to the output line, and wherein the control unit:

turns the transistor of the second pixel to an on state in a period in which a signal is read out from the first pixel to the output line;

turns the transistor of the second pixel to an off state precedential to a period in which a signal is read out from the second pixel to the output line; and turns the transistor of the second pixel to the on state again in the period in which a signal is read out from the second pixel to the output line.

16. An imaging system comprising:

an imaging apparatus; and a signal processing unit configured to generate an image using a signal output by the imaging apparatus, wherein the imaging apparatus includes a plurality of pixels and an output line, the plurality of pixels each including a photoelectric conversion unit configured to accumulate electric charges, a floating diffusion region, a transfer transistor configured to transfer the electric charges of the photoelectric conversion unit to the floating diffusion region, an amplification transistor configured to output a signal that is based on an electric potential of the floating diffusion region, to the output line, a transistor connected to the floating diffusion region, and a control unit, wherein a signal is read out from a second pixel of the plurality of pixels to the output line, after a signal is read out from a first pixel of the plurality of pixels to the output line, and wherein the control unit:

turns the transistor of the second pixel to an on state in a period in which a signal is read out from the first pixel to the output line;

turns the transistor of the second pixel to an off state precedential to a period in which a signal is read out from the second pixel to the output line; and turns the transistor of the second pixel to the on state again in the period in which a signal is read out from the second pixel to the output line.

* * * * *